(12) United States Patent
Idgunji et al.

(10) Patent No.: US 8,519,775 B2
(45) Date of Patent: Aug. 27, 2013

(54) VOLTAGE REGULATION OF A VIRTUAL POWER RAIL

(75) Inventors: Sachin Satish Idgunji, San Jose, CA (US); Bal S Sandhu, Fremont, CA (US)

(73) Assignee: ARM Limited, Cambridge (GB)

(*) Notice: Subject to any disclaimer, the term of this patent is extended or adjusted under 35 U.S.C. 154(b) by 137 days.

(21) Appl. No.: 13/137,224

(22) Filed: Jul. 28, 2011

(65) Prior Publication Data
US 2013/0027123 A1    Jan. 31, 2013

(51) Int. Cl.
*H03K 3/01* (2006.01)

(52) U.S. Cl.
USPC .......................................................... 327/534

(58) Field of Classification Search
USPC ................. 327/534, 535, 537, 538, 540, 541, 327/543
See application file for complete search history.

(56) References Cited

U.S. PATENT DOCUMENTS

| | | | | |
|---|---|---|---|---|
| 6,118,328 A * | 9/2000 | Morikawa | ...................... | 327/534 |
| 7,265,605 B1 * | 9/2007 | Vasudevan | ...................... | 327/534 |
| 7,436,206 B2 * | 10/2008 | Kurotsu | .......................... | 326/34 |
| 7,671,663 B2 * | 3/2010 | Houston et al. | ................ | 327/534 |
| 7,675,317 B2 * | 3/2010 | Perisetty | .......................... | 326/38 |

OTHER PUBLICATIONS

A. Valentian et al, "Gate Bias Circuit for an SCCMOS Power Switch achieving maximum leakage reduction" IEEE 2007, pp. 300-303.
L.T. Clark et al, "Standby Power Management for a 0.18μm Microprocessor" ISLPED'02, Aug. 2002, 6 pages.

* cited by examiner

*Primary Examiner* — Jeffrey Zweizig
(74) *Attorney, Agent, or Firm* — Nixon & Vanderhye P.C.

(57) ABSTRACT

A voltage regulator for regulating a voltage level of a virtual power rail supplying power to logic circuitry in a low power data retention mode is disclosed. The voltage regulator comprises: switching circuitry having a transistor for coupling said virtual power rail to a power supply having a supply voltage level; control circuitry responsive to a signal indicating the logic circuitry is to enter the low data power retention mode to control the switching circuitry to switch to a conductive state in which the transistor is operating in a saturation region of operation and supplying a saturation current from the power supply via the virtual power rail to the logic circuitry; and a leakage power controller for adjusting a voltage level of the virtual power rail to control leakage power. The leakage power controller is configured to supply a bias voltage to the well in which the switching circuitry is formed, the saturation current of the switching circuitry being dependent on a value of the well bias voltage. The leakage power controller is configured to adjust the well bias voltage of the switching circuitry thereby varying the saturation current and the voltage level of the virtual power rail.

22 Claims, 10 Drawing Sheets

VOLTAGE REGULATION OF A VIRTUAL POWER RAIL

BACKGROUND OF THE INVENTION

1. Field of the Invention

The field of the invention relates to the field of logic circuitry and in particular to the supply of power to logic circuitry in both functional and low power data retention modes.

2. Description of the Prior Art

It is known to provide power to logic circuitry using power rails connected via switch blocks to virtual power rails. The logic circuitry then draws its power from the virtual power rails. The switch blocks, which are typically high threshold voltage header and/or footer transistors, can be used to isolate the virtual power rail from the main power rail and accordingly isolate the logic blocks from the power supply and turn the circuitry off. This is useful in reducing power consumption of the logic circuitry. A problem with this is that state (e.g. data values, instruction values, configuration etc) within the logic circuitry is lost when it is isolated from the power supply. Furthermore, it can take a disadvantageously long period of time to restore this state and recommence processing using the logic circuitry when it is desired to switch out of the low power mode.

One way of at least partially addressing these problems is to provide balloon latches within the logic blocks to store relevant state signal values using circuits which do remain continuously powered (and are typically formed with high voltage threshold transistors having low leakage currents) so that the signal state values can be restored into the logic block when required and then processing recommenced. A problem with this approach is the overhead associated with the circuit area of the balloon latches, the control thereof and the time taken to restore the signal values from the balloon latches into the logic blocks.

Standby leakage current is becoming more of a problem on chips as the channel length continues to decrease on leading process nodes resulting in higher channel leakage. The dependence of standby leakage on supply voltage is a well known phenomena and a reduction of 15% in supply voltage can result in 50% reduction in leakage current. Since a modern microprocessor can have up to 2 billion transistors on the chip, the total standby leakage current contributes a significant amount to the power drain on the chip thereby impacting the overall energy efficiency of the system Methods of adaptive power management or dynamic voltage scaling (DVS) in integrated circuits have been practiced for some years in the electronics industry to reduce the power dissipation on a chip. Adaptive power management becomes even more important with designs on leading edge nanometer technology where the leakage power is becoming as high as the dynamic power. The supply voltages have to be reduced with technology scaling to reduce dynamic power. However, a side effect of scaling is that these threshold voltages need to be lowered to prevent speed degradation which makes the transistors leakier. For example, for each 100 mV reduction in threshold voltage, the sub-threshold leakage current can increase by a factor of ten. Since mobile products are in standby mode most of the time, sometimes with variable standby operating times, an effective way of managing active leakage is by lowering the voltage of the logic when it is in a standby mode.

U.S. Pat. No. 7,737,720 assigned to the same applicant as this application provides a way of modulating (switching on and off repeatedly) the connection between the power supply, and the virtual power rail in order to control the voltage level of the virtual power rail to reduce power consumption within the integrated circuit.

U.S. application Ser. No. 12/591,017 assigned to the same applicant as this application discloses a power controller that selects the number of power control transistors which couples a virtual power rail to the power supply, so that the virtual power rail may be held at an intermediate voltage level and accordingly the power consumed by the logic circuitry can be reduced whilst the logic circuitry is supplied with sufficient power that retains its state.

It would be desirable to be able to reduce power consumption in standby mode, without losing data and without having an extended wake up time.

SUMMARY OF THE INVENTION

A first aspect of the present invention provides a voltage regulator for regulating a voltage level of a virtual power rail supplying power to logic circuitry in a low power data retention mode, said voltage regulator comprising: switching circuitry comprising at least one semiconductor device formed within a doped well for coupling said virtual power rail to a power supply having a supply voltage level; control circuitry responsive to a signal indicating said logic circuitry is to enter said low data power retention mode to control said switching circuitry to switch to a conductive state in which said switching circuitry is operating outside of a linear region of operation and supplying a current from said power supply via said virtual power rail to said logic circuitry; and a leakage power controller for adjusting a voltage level of said virtual power rail to control leakage power, said leakage power controller being configured to supply a bias voltage to said well in which said switching circuitry is formed, said current of said switching circuitry being dependent on a value of said well bias voltage, said leakage power controller being configured to adjust said well bias voltage of said switching circuitry thereby varying said saturation current and said voltage level of said virtual power rail.

The present invention recognises that the power required for logic circuitry to operate in a normal functional mode is greater than that required for the same circuitry in a low power data retention mode where it simply needs to retain current state and not process data. It also recognises that reducing the power supplied to logic circuitry has a significant effect on the leakage currents of that circuitry and thus, reduces power loss. However, reducing voltage levels too far carries the risk of data loss and increased wake up times.

The present invention addresses these problems by providing a way of regulating the voltage levels applied to logic circuitry in a low power data retention mode that has a fine level of control, allowing a desired voltage level of a virtual power rail to be selected and maintained accurately. Having a fine level of control allows one to manage power savings and carries with it a reduced risk of data loss. Furthermore, adjusting the virtual rail voltage level by varying the well bias not only allows accurate control but the additional circuitry required for this is small and can be provided alongside other power gating circuitry that is required for switching between operational and shut down modes.

In some embodiments said switching circuitry is operating in a saturation region of operation and said current supplied from said power supply via said virtual power rail is a saturation current.

When the switching circuitry is operating in the saturation region of operation then a change in the well bias voltage will change the voltage level of the virtual power fail in a known and very controllable way.

Although the switching circuitry can be formed from any semiconductor device that operates outside of the linear region in a saturation or near saturation region and whose saturation current varies with well bias voltage, in some embodiments the switching circuitry comprises at least one transistor. A transistor is a convenient switching device for use in this context as there are often other transistors arranged in such circuits for power gating and thus, it is area efficient and convenient to arrange additional transistors in parallel with the power gating transistors to perform this voltage regulation function. Furthermore, transistors are common elements in circuits and as such their design and characteristics are well known and thus, designing one to operate in a saturation region when supplying currents to logic circuitry that it in a low power data retention mode is relatively straightforward.

In some embodiments, said leakage power controller comprises a voltage sensor for sensing a voltage level of said virtual power rail, said leakage power controller being responsive to detecting a voltage level of said virtual power rail varying away from a predetermined voltage to adjust said well bias voltage to mitigate said detected variation in order to maintain said voltage level of said virtual power rail close to said predetermined voltage.

Although the leakage power controller may be designed to simply set the well bias voltage of the switching circuitry to achieve a desired voltage level of the virtual power rail, in some embodiment it further comprises a voltage sensor and is responsive to detecting the virtual voltage level varying away from the desired level to adjust the well bias voltage. In this way, by the use of a simple feedback system the predetermined voltage can be accurately held at a desired level in a simple manner.

In some embodiments, said leakage power controller is configured: in response to said voltage sensor sensing said voltage level of said virtual power rail moving away from said supply voltage level such that a voltage level applied across said logic circuitry falls below a predetermined low threshold value, to adjust said well bias voltage to increase said saturation current and thereby adjust said voltage level of said virtual power rail towards said supply voltage level; and in response to said voltage sensor sensing said voltage level of said virtual power rail moving towards said supply voltage level such that a voltage applied across said logic circuitry rises above a predetermined high threshold value, to adjust said well bias voltage to decrease said saturation current and adjust said voltage level of said virtual power rail towards said supply voltage level, thereby maintaining a voltage level of said virtual power rail within a range determined by said threshold values.

The system may be designed to keep the virtual voltage level within predetermined limits. In such a design, the voltage sensor senses the voltage level moving out of this desired range and adjusts the bias voltage accordingly by either increasing or decreasing the saturation current, the virtual power rail voltage changing with this change in saturation current. In this regard, generally if the forward bias of the well is increased the saturation current increases while if the reverse bias increases the saturation current decreases.

In some embodiments, the voltage regulator comprises an input for receiving a voltage level value from a user, said leakage power controller being responsive to receipt of a value at said input to reset said predetermined voltage level to said received value.

Although the predetermined voltage level may be set internally within the voltage regulator it can also be input by a user such that under certain conditions such as extreme temperatures or when operating in a region where there is much noise the predetermined voltage level can be set by a user to be higher than would usually be the case to avoid an increase in errors.

In some embodiments, the voltage regulator comprises an error indication input for receiving an indication of error rate from said logic circuitry, said leakage power controller being configured to adjust said predetermined voltage level such that a voltage level applied across said logic circuitry is increased in response to said error rate rising above a high error rate threshold value and to adjust said predetermined voltage level such that a voltage level applied across said logic circuitry is decreased in response to said error rate falling below a low error rate threshold value.

Alternatively and/or additionally the voltage regulator may have an input for receiving an error rate indication from the logic circuitry. In this case, the voltage level of the virtual voltage rail can be set to a value that generates a required error rate. Thus, if the detected error rate is increasing to unacceptable levels the voltage level of the virtual voltage rail can be changed to increase the voltage level supplied across the logic circuitry and the error rate will thereby fall.

In some embodiments, said predetermined voltage level is selected in dependence upon characteristics of said logic circuitry in order to maintain said voltage level above a level sufficient to retain data and below said supply voltage level to reduce power leakage.

When operating in low power data retention mode the circuit does not operate in the normal way switching state and processing data and so the voltage level needs to be maintained high enough so that state is not lost and data is retained but it can be maintained at a level that is lower than is required for the logic circuitry to function normally. Thus, the voltage regulator is generally set to maintain the virtual voltage level at a level that is sufficient to retain data and that is below the supply voltage level.

In some embodiments, said switching circuitry comprises at least one weak transistor having a low conductance when switched to said conductive state, such that it operates in said saturation region of operation when supplying current to said logic circuitry.

The switching circuitry may be made up of one or more weak transistors, that is a transistor that is sized such that when supplying current to the logic circuitry in a low power data retention mode it is operating in its saturation region and a saturation current is supplied. In this region, the amount of current supplied is dependent on the well bias voltage and thus, this saturation current can be varied by varying the well bias voltage. In effect when operating in the saturation region the transistor acts almost like a constant current source whose current varies with well bias voltage, an increase in forward well bias voltage causing the threshold voltage of the transistor to increase and thereby reducing the current that can be sourced through the transistor.

In the case that the switching circuitry comprises a plurality of weak transistors then it is advantageous if they are formed in a shared well. In this way adjusting of the well bias voltage changes all of the transistors saturation currents together.

In some embodiments, said plurality of weak transistors are arranged in parallel with each other, such that said drain nodes are coupled to said logic circuitry and said source nodes are coupled to said power supply.

Where there are a plurality of weak transistors they are advantageously arranged in parallel with each other to supply current from the power supply to the logic circuitry.

In some embodiments, the voltage regulator further comprises at least one strong power transistor, said at least one strong transistor having a high conductance when switched to a conductive such that when supplying current to said logic circuitry said strong transistor is operating in said linear region of operation; said control circuitry being responsive to a signal indicating said logic circuitry is to operate in a functional mode to control said at least one strong power transistor to be in said conductive state operating in said linear region and supplying a current from said power supply to said logic circuitry; and being responsive to a signal indicating said logic circuitry is to operate in said low power retention mode to switch said at least one strong power transistor to a non-conductive state.

In addition to the switching circuitry for regulating the voltage supply in low power data retention mode, the voltage regulator may also have strong power transistors for supplying power in power on mode. These transistors are sized such that when supplying power to the logic circuitry they are operating in the linear region and the amount of current supplied will change with voltage as required by the logic circuitry.

In some embodiments, said power supply comprises a high voltage rail and a ground rail and said switching circuitry comprises header circuitry arranged between said high voltage rail and said virtual rail, said virtual rail being a high voltage virtual rail and said at least one transistor comprising at least one pmos transistor.

While in other embodiments, said power supply comprises a high voltage rail and a ground rail and said switching circuitry comprises footer circuitry arranged between said low voltage rail and said virtual rail, said virtual rail being a ground virtual rail and said at least one transistor comprising at least one nmos transistor.

The switching circuitry in the voltage regulator could be either header or footer circuitry depending on a particular implementation. In the case that it is header circuitry it will be formed of at least one PMOS transistor in an n-well and in the case that it is footer circuitry it will be at least one NMOS transistors in a p-well.

A second aspect of the present invention provides an integrated circuit comprising at least one voltage regulator according to a first aspect of the present invention and at least one block of logic circuitry, said at least one voltage regulator being configured to regulate a voltage level supplied to said at least one block of logic circuitry.

A third aspect of the present invention provides a method of regulating a voltage level of a virtual power rail supplying power to logic circuitry in a low power data retention mode comprising the steps of: in response to a signal indicating said logic circuitry is to enter said low power data retention mode, switching semiconductor switching circuitry formed within a doped well to a conductive state in which said semiconductor switching circuitry is operating in a saturation region of operation and supplying a saturation current from a power supply via said virtual power rail to said logic circuitry; and adjusting a bias voltage supplied to a well of said switching circuitry to adjust said voltage level of said virtual power rail, wherein said saturation current of said switching circuitry is dependent on a value of said well bias voltage, such that adjusting said well bias voltage of said switching circuitry varies said saturation current and therefore said voltage level of said virtual power rail.

A fourth aspect of the present invention provides a voltage regulator means for regulating a voltage level of a virtual power rail supplying power to logic circuitry in a low power data retention mode, said voltage regulator comprising: switching means to for coupling said virtual power rail to a power supply having a supply voltage level, said switching means comprising at least one semiconductor device formed in a doped well; control means responsive to a signal indicating said logic circuitry is to enter said low data power retention mode for controlling said switching circuitry to be switched to a conductive state in which it is operating in a saturation region of operation and for supplying a saturation current from said power supply via said virtual power rail to said logic circuitry; and a leakage power control means for adjusting a voltage level of said virtual power rail to control leakage power, said leakage power control means being for supplying a bias voltage to a well of said switching circuitry, said saturation current of said switching circuitry being dependent on a value of said well bias voltage, said leakage power control means being for adjusting said well bias voltage of said switching circuitry thereby varying said saturation current and said voltage level of said virtual power rail.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
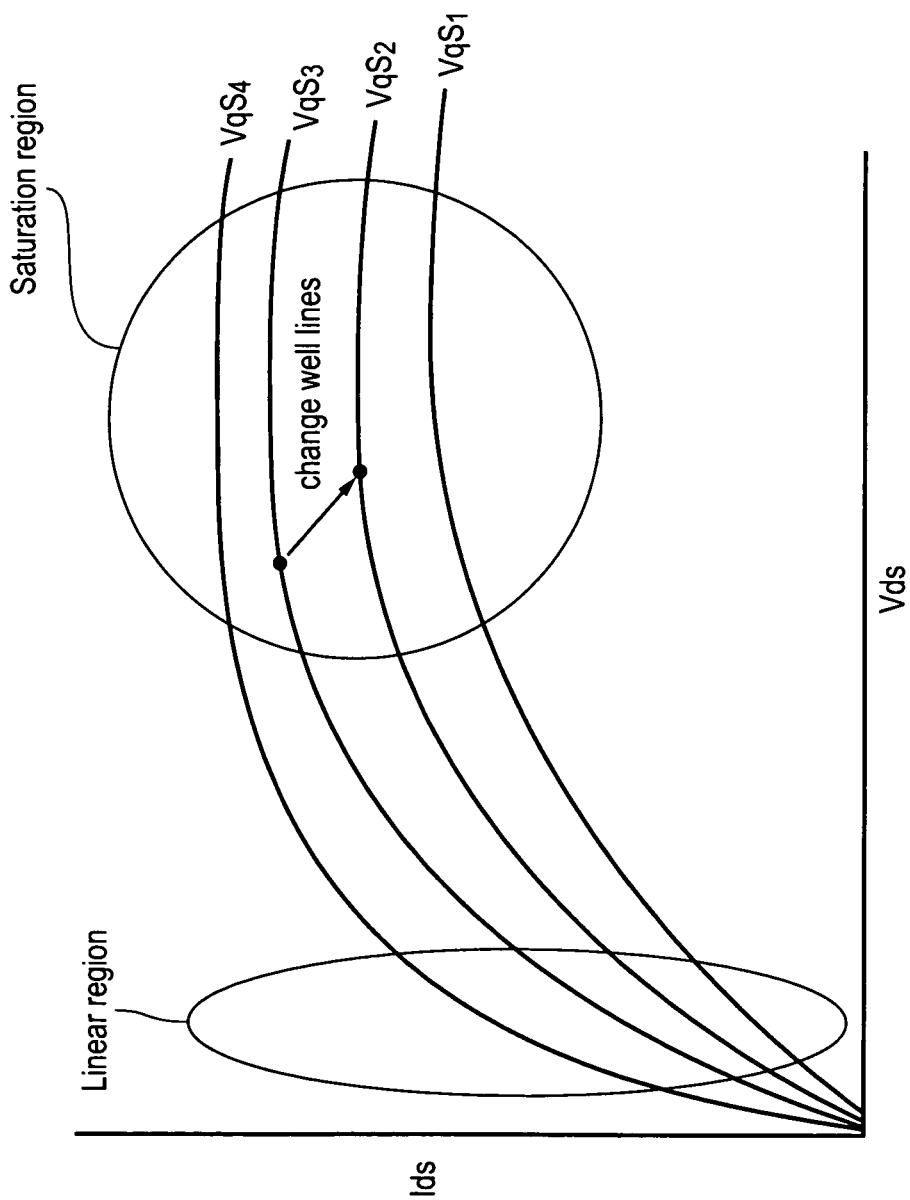
FIG. 1 shows a graph of current through against voltage across a transistor and illustrating the different regions of operation of the transistor.

FIG. 1 shows a graph illustrating how the current through a transistor varies with the voltage across it at different gate voltages. As can be seen when a transistor is in conducting mode, it operates at first in a linear region where an increase in voltage across the transistor produces a corresponding increase in current. At a certain point it reaches a saturation mode, where it cannot conduct any more current and thus, as the voltage across the transistor changes it continues to output approximately the same current. In this regard although the current is almost constant there is a slight slope which is referred to as channel length modulation, however, it is negligible when compared to the rate of change of current when operating in the linear region. This saturation current varies with Vgs which is the voltage level at the source Vs minus the voltage level at the gate Vg minus the threshold voltage Vth of the transistor. Thus, changing the threshold voltage of the transistor will change the saturation current.

The threshold voltage of a transistor can be varied by providing a bias to a well of the transistor. Providing a forward bias to the well decreases the threshold voltage and increases the saturation current of the transistor as can be seen from the graph. Increasing Vgs produces increasing saturation currents. Reverse biasing the well of the transistor increases the threshold voltage and therefore decreases the saturation current of the transistor.

From this graph it can be seen that a transistor that is operating in the saturation region or even in the near saturation region can have its saturation current varied by varying a bias voltage applied to the well.

Figure 2:
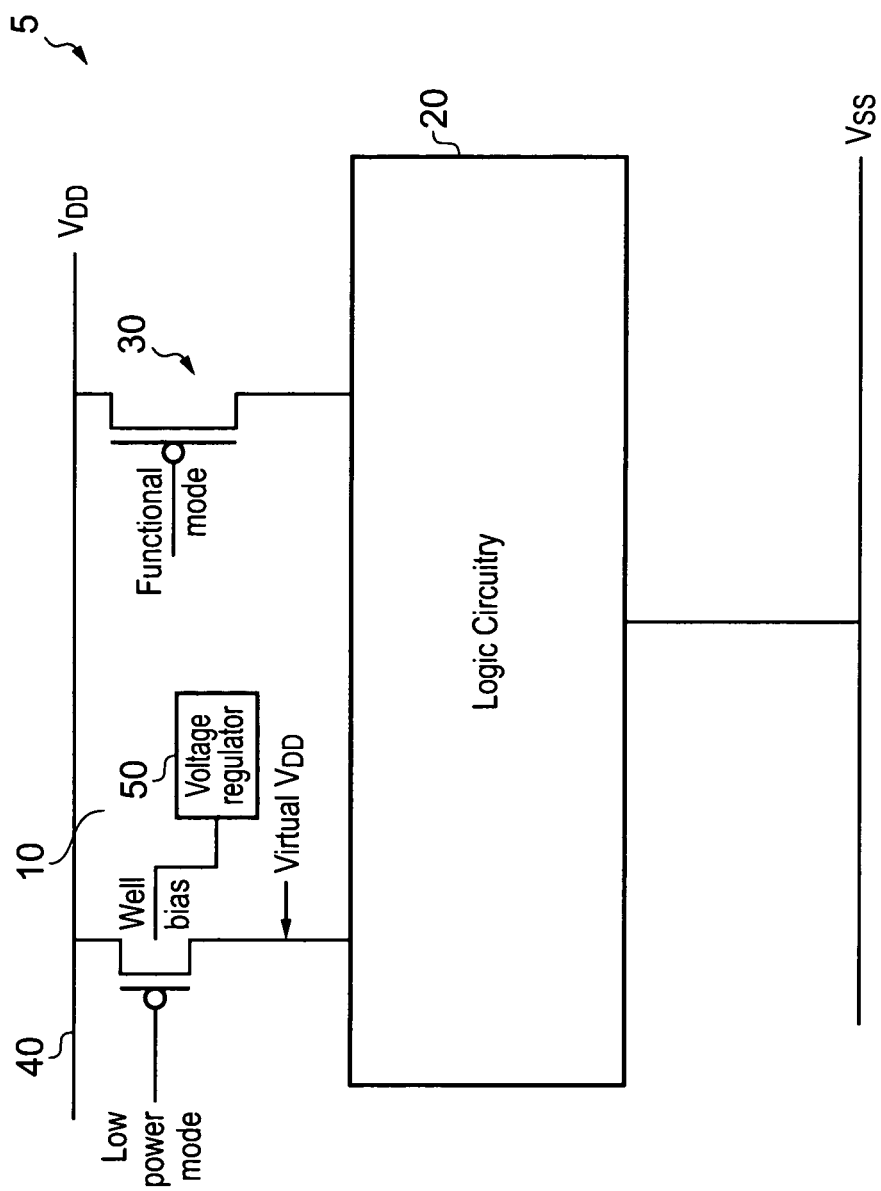
FIG. 2 shows logic circuitry and an on-chip voltage regulator header device for supplying a predetermined virtual voltage level according to an embodiment of the present invention.

FIG. 2 schematically shows a circuit according to an embodiment of the present invention. This circuit shows a voltage regulator 10 within an integrated circuit 5 having a high voltage rail VDD, a low voltage rail VSS and logic circuitry 20 powered by a voltage difference between the rails.

The integrated circuit 5 has a header power transistor 30 for supplying power from high voltage rail VDD to logic circuitry 20 in operational mode and for isolating logic circuitry 20 from the high power rail in low power modes. Thus, this header power transistor 30 is switched on and off in response to a functional mode signal indicating whether the transistor is to operate in functional mode or not.

The integrated circuit 5 also has a voltage regulator 10 for regulating the voltage level supplied via transistor 40 to logic circuitry 20. Transistor 40 is used to supply power to logic circuitry 20 in low power data retention mode. In this mode the logic circuitry is not being clocked or functioning in the normal manner and as such does not need the full voltage level of the power supply to operate, however, it does require a sufficient voltage level to allow it to retain data and to allow it to be powered up to a voltage level sufficient for functional mode operation in a reasonable time. Thus, voltage regulator 10 is used to regulate the voltage level supplied to the logic circuitry to a desired value.

Thus, in response to a low power mode indicator being received transistor 40 is switched on and supplies a current to logic circuitry 20. Transistor 40 is sized such that it is a relatively weak device. Thus, once switched on and supplying current to logic circuitry 20 it is operating in a saturation or near saturation region of operation, so that an additional voltage drop across the transistor will not increase the current supplied. The amount of current supplied can instead be controlled by supplying a bias voltage to the well of the device via voltage regulator 50.

As was explained with respect to FIG. 1 reverse or forward biasing the well of a transistor operating in saturation mode affects its saturation current. Increasing the saturation current through transistor 40 increases the current supplied to logic circuitry 20. The increased saturation current will cause the transistor to operate closer to the linear region thereby causing the voltage across the transistor to reduce. In a similar manner decreasing the saturation current results in a decrease of the voltage level of the virtual voltage rail virtual VDD due to increasing voltage drop across the transistor. In this way by suitably sizing the transistor 40 so that it operates in a saturation region when supplying current to logic circuitry 20, and by providing a bias to the well, a value of virtual VDD can be selected that is sufficient to maintain state but is lower than would be required in function mode such that power leakage is reduced.

It should be noted that header power transistor 30 is sized to be a strong device so that when it is supplying power to logic circuitry 20 it is operating in the linear region of FIG. 1 such that an increase in voltage difference across the transistor will generate an increase in current.

Figure 3:
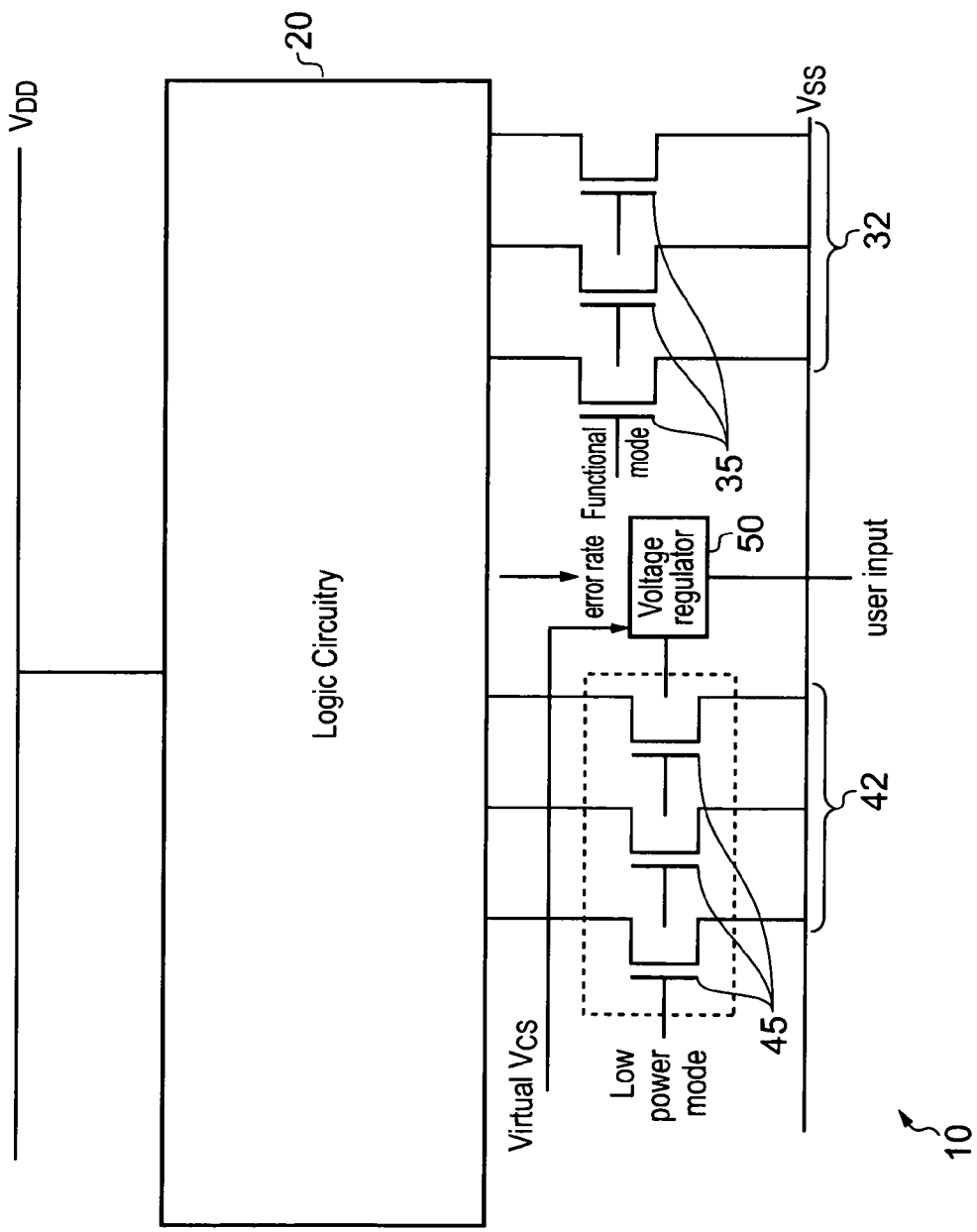
FIG. 3 shows logic circuitry and an on-chip voltage regulator footer device for supplying a predetermined virtual voltage level according to an embodiment of the present invention.

FIG. 3 shows schematically a similar system to that of FIG. 2 however in this embodiment the transistors are footer devices rather than header devices and are therefore formed of NMOS transistors.

Furthermore, in this embodiment the voltage regulator 10 is made up of several transistors arranged in parallel 42. When sizing these footer transistors 45 to enable them to have the required characteristics, rather than sizing a single transistor with the required characteristics, generally a plurality of transistors are arranged in parallel and are sized such that as a whole they have the required characteristics.

In this embodiment the power transistors 32 are formed from a plurality of footer transistors 35 arranged in parallel. Similarly, the switching circuitry 42 used for voltage regulation is formed from a plurality of individual transistors 45 formed in the same well(s). Thus, voltage regulator circuitry 50 controls the bias voltage to the well(s) of all of these devices. The well(s) these devices are formed in is generally remote from the wells of the other devices. This means that the biasing voltage does not affect the performance of the other devices and that the capacitance of the wells is low making it easier to change the bias voltage and requiring less power to do so.

Voltage regulator circuitry 50 in this embodiment has three inputs, an input from the virtual voltage rail allowing a voltage sensor within the voltage regulator circuitry 50 to monitor the voltage level of this rail, an input from a user and an error rate input from the logic circuitry 20. The user input allows a user to specify a desired voltage level for the virtual voltage rail to be held at in low power data retention mode, and the error rate input allows the logic circuitry to feedback a current error rate to voltage regulator circuitry 50.

Thus, voltage regulator circuitry 50 may be configured to have a default voltage level that it is configured to set the virtual voltage rail to. Thus, on entry to the low power mode, it will set the default well bias and then check the virtual voltage rail and make adjustments to the well bias voltage in response to detecting that the virtual voltage rail is not at the desired voltage level. This may be done using threshold values such that if the voltage moves out of a certain range adjustments are made.

A user may override the default settings by inputting a desired voltage level. The user may do this if he knows that the system is operating in an environment where there are likely to be more errors, due perhaps to large temperature ranges, or he may do it if the system is performing tasks where it is important that errors are reduced. In response to this user input the voltage regulator circuitry 50 resets the desired voltage level of the virtual rail and the threshold values are also correspondingly reset, the voltage regulator circuitry then acts to keep the virtual voltage rail within the new range.

The error rate input provides the voltage regulator circuitry 50 with an indication of the current error rate within logic circuitry 20. In some embodiments this value falling outside of a predetermined range triggers the voltage regulator circuitry to reset the desired virtual voltage rail voltage level, in order to bring the error rate back into the predetermined range. The voltage level of the virtual voltage rail affects the error rate in the logic circuitry and some embodiments may use detection of this error rate to adjust the voltage level that the logic circuitry operates at. In this way the leakage power loss can be kept low while not allowing the error rate to become too high.

Figure 4:
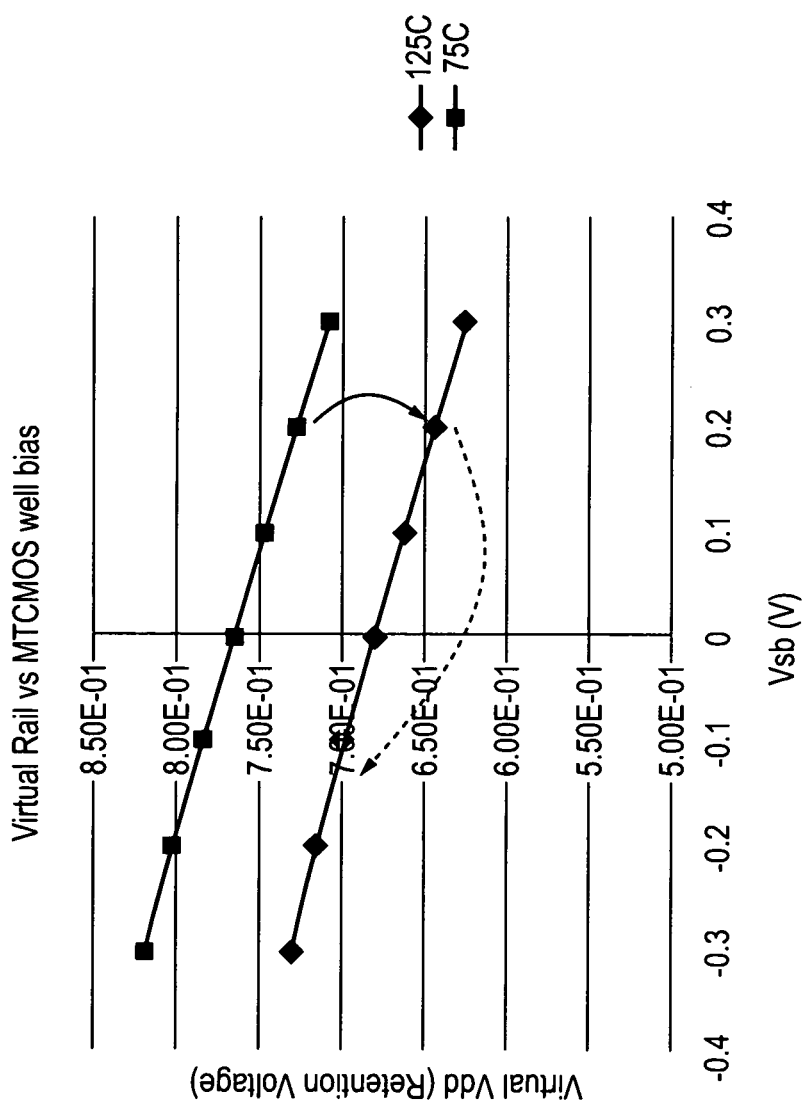
FIG. 4 shows how the voltage level of the virtual rail changes with well bias.

FIG. 4 shows graphically the impact of varying MTCMOS well bias voltage on retention voltage for a system such as is shown in FIG. 2. As the well bias is moved from nominal point (Vsb=0, no well bias) to increasing the bias (reverse bias well), the threshold voltage of the MTCMOS device (Vth) rises and causes the weak header to enter saturation at a lower Ids, hence increasing Vds and lowering the Virtual Vdd. The same phenomenon reverses when the bias of the MTCMOS header well is decreased below nominal. This causes the Vth to drop causing the device to enter saturation at a higher Ids, reducing the Vds and increasing the Virtual Vdd.

This basic mechanism can be used adaptively in an effective manner, e.g. when the temperature of the system changes. FIG. 4 shows what occurs when the system temperature deceases from 125 to 75. In response to this the voltage on the virtual rail drops (as shown by the solid line curve). This might reduce the voltage to a point that below the desired retention voltage making the system susceptible to noise and soft error induced failure. To adjust this back to the point of safe retention, the well bias of the weak header is decreased, the threshold voltage of the MTCMOS device (Vth) falls and causes the weak header to enter saturation at a higher Ids, hence decreasing Vds and raising the Virtual Vdd to acceptable levels.

Figure 5:
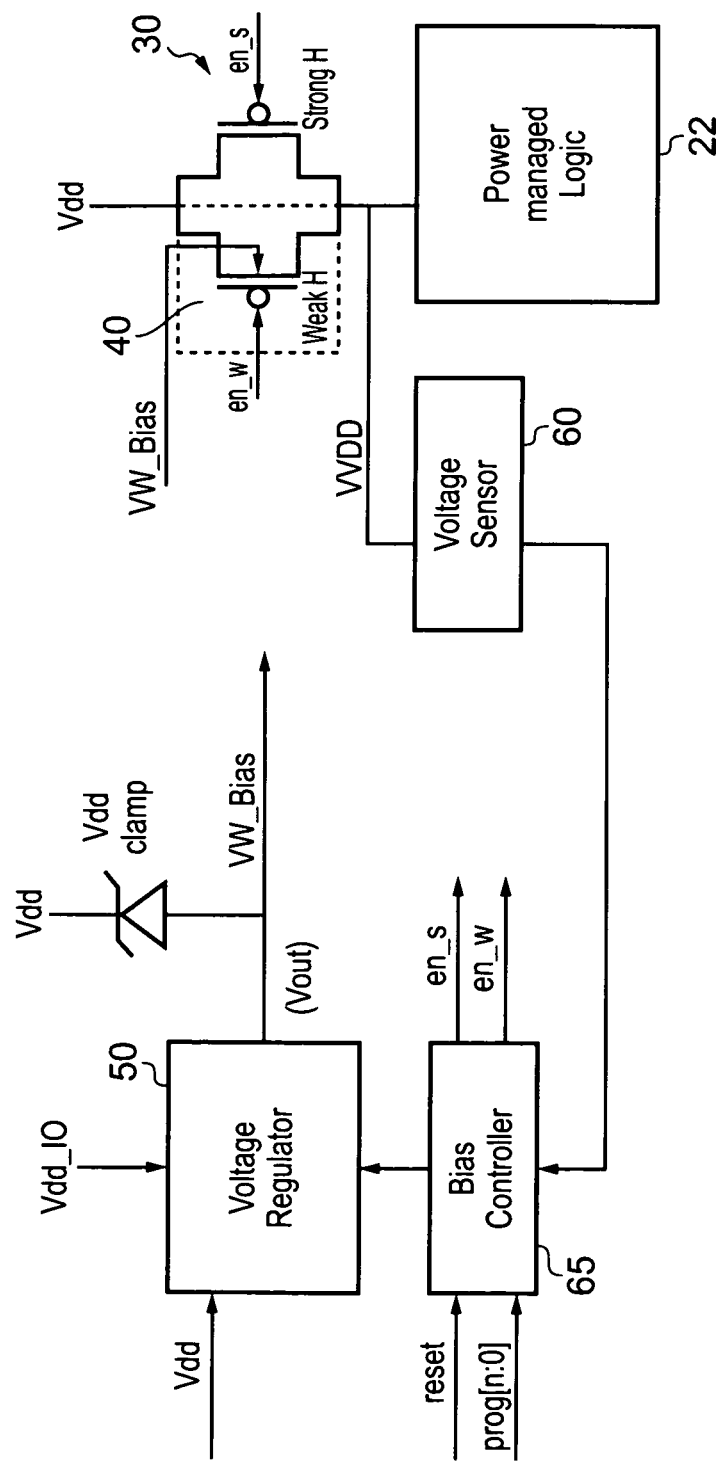
FIG. 5 shows a voltage regulator with adaptive control according to an embodiment of the present invention.

FIG. 5 shows a further embodiment of the present invention. In this embodiment the power managed logic is powered by header devices. There are strong header power transistors 30 for switching between full power and shut off modes and weak header transistors 40 for supplying power to power managed logic 22 in a low power data retention or standby mode.

The voltage level output by the weak transistors 40 corresponds to the virtual power rail and is sensed by voltage sensor 60. The voltage level sensed is input to bias controller 65 which controls voltage regulator 50 that supplies the well bias voltage applied to the n-well of the PMOS weak device 40.

The idea behind this mechanism is to set the voltage regulator 50 output to VDD+/−Vovr where the value of Vovr is adaptively adjusted based on the signals received from voltage sensor 60. In this system the saturation current from the weak header transistors 40 balances the leakage current through the power managed logic 22 forming a voltage divider which is balanced by the current through the headers and the leakage through the power managed logic 22. To maintain a given voltage at VVDD which is less than VDD, the weak header well bias can be controlled by the output of the on-chip voltage regulator (Vdd+/−Vovr).

The system functions as follows. The voltage regulator 50 is disabled during system power up by a POR reset signal. In response to a low power data retention signal the weak transistors 40 are turned on and due to their size operate in saturation mode. Initially the output of the voltage regulator 50 drives the n-well bias of these weak transistors 40 to VDD which maintains zero well bias (Vsb) on these devices. Voltage regulation is enabled by programming the bias controller 65. This controls the voltage regulator 50 to adjust the well bias overdrive voltage, Vovr, in dependence upon signals received from the voltage sensor 60.

The adaptive nature of the feedback system allows for accurate control of the voltage of the virtual power rail and thus, of the leakage current. The feedback control could be realized with a SAR data converter. The resolution of the converter depends on the accuracy desired but a 3 to 4 bit SAR should be more than adequate. The output of the data converter is used to make an adjustment to a reference voltage which is used to tune the value output by the voltage regulator. This value in turn is used to drive the well bias supply pins of the weak transistors 40.

Figure 6:
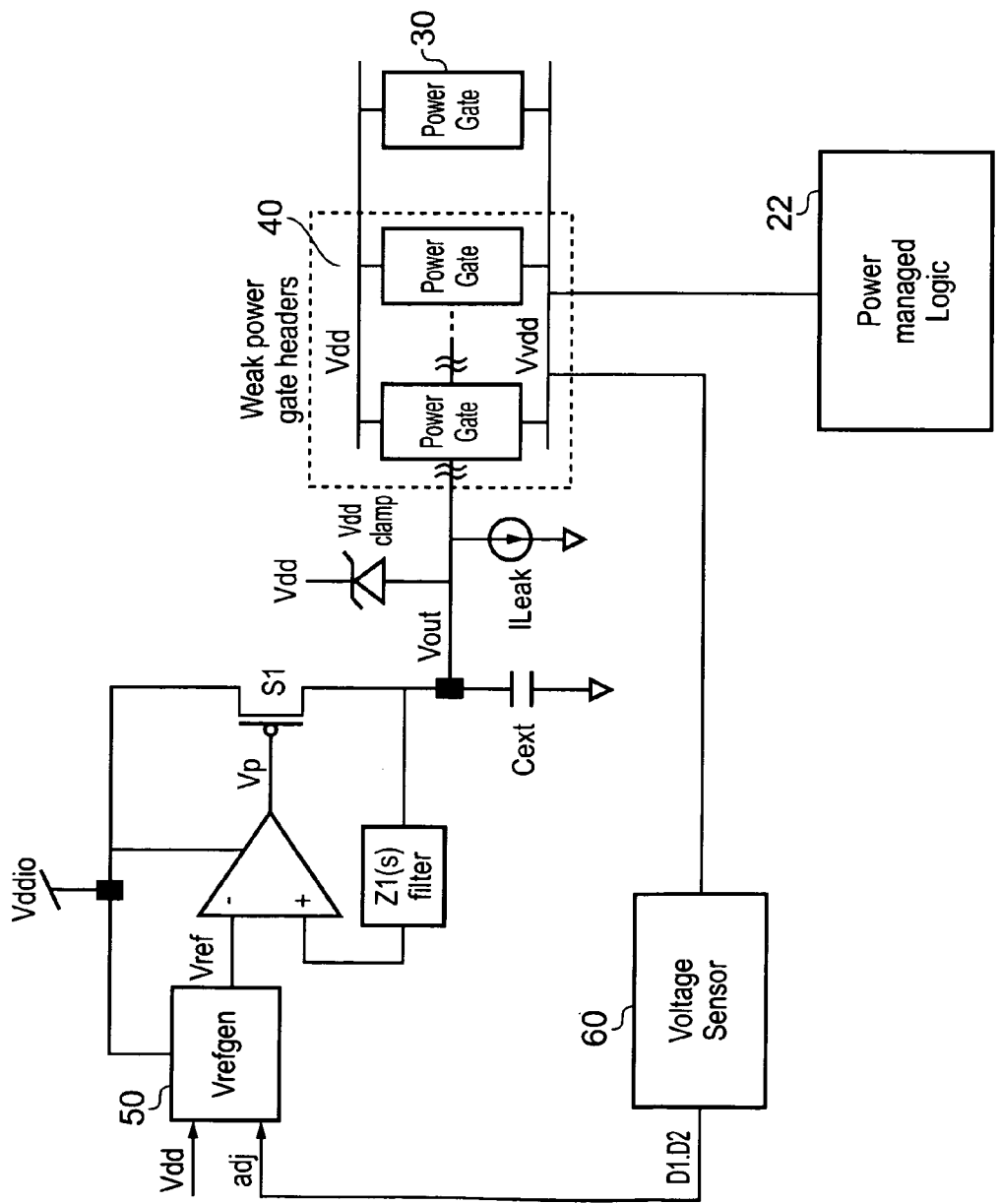
FIG. 6 shows a further embodiment of a voltage regulator according to an embodiment of the present invention.

FIG. 6 shows a further embodiment of a voltage regulator according to an embodiment of the present invention. In this embodiment voltage sensor 60 provides a digital code to the voltage regulator 50 to adjust the well bias voltage to compensate for both leakage and process skew. The value output by the voltage regulator 50 needs to be adjusted as the characteristics of the power managed logic 22 vary as a function of the process corners and temperature of operation, which in turn gets reflected in changes to the virtual rail voltage (VVDD). For example, if the silicon material was "fast skew" and the temperature on the chip was hot, then the leakage current would be at a high level. In that case, the value of the Vovr would be lowered by the power controller and the voltage regulator to maintain a given VVDD. On the other hand, if the silicon material was "slow skew" and the chip temperature was cold, then the leakage current (of the logic block) would be at a low level. In that case, the value of the Vovr voltage would be increased to maintain a given VVDD.

In this embodiment the voltage range of the Vovr is set between 0 mV and 250 mV and depends on the magnitudes of D1 and D2 output by the voltage sensor 60 which vary as a function of the leakage and silicon material. Therefore, maintaining an optimal or near optimal well bias point allows the weak power gate switches to maintain their saturation current to allow a near fixed VVDD (<VDD) during the active leakage state.

The well-bias control is applied to the drowsy mode power gated sub-systems 30 within the chip to support optimal low-voltage retention based standby modes. One or more power gated regions can share a single external VDD off-chip voltage regulator to provide the active power efficiently. This is good for system/board-level cost that supports fast and efficient power-gating, PG, and optional lowered voltage retention and power-gating as an alternative to balloon latch based data retention.

In the application of PMOS "header" switches described here, this well biasing method offers a large control in granularity and allows the virtual rail voltage to be maintained at a required voltage in a smooth manner The adaptive MTCMOS well bias voltage regulator described above then improves the leakage current and power consumption by tuning the well bias level to reduce the current through the power gate switches in response to the sensed environmental conditions. System level software is responsible for entering the appropriate depth of low-power standby state whenever workload processing permits.

Figure 7:
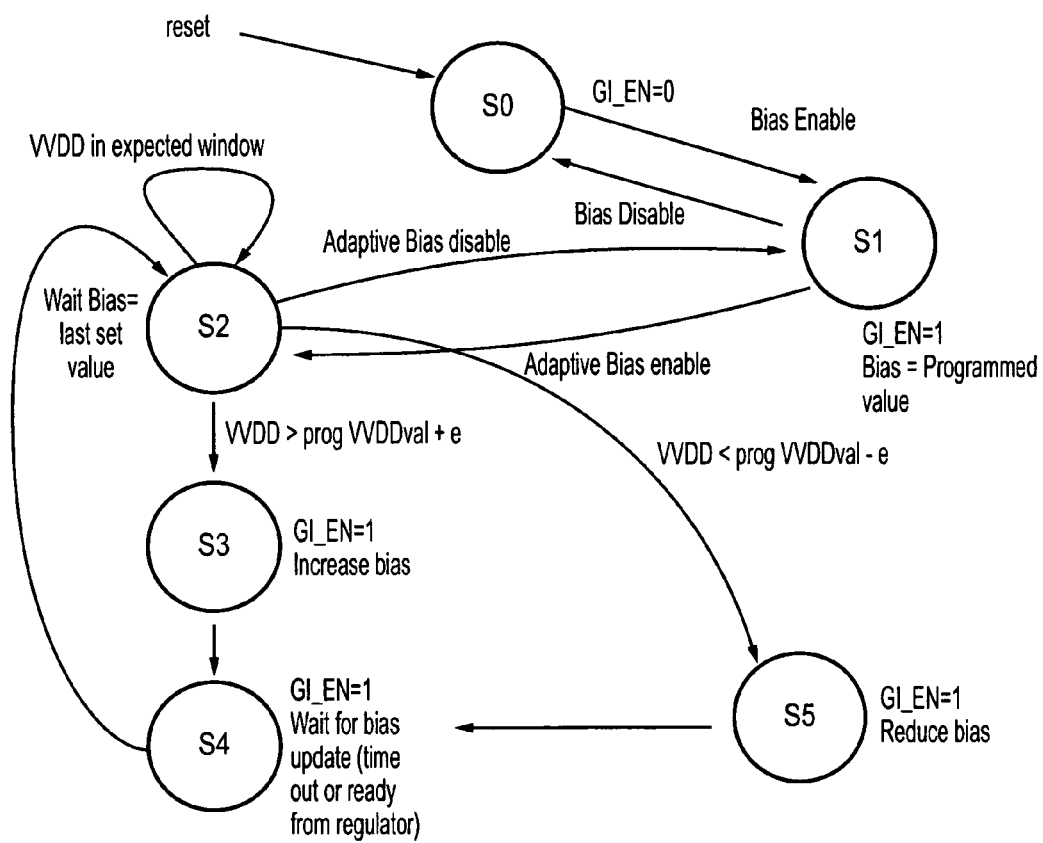
FIG. 7 shows the states of the bias controller of FIG. 5.

The adaptive gate bias controller in FIG. 5 used a sequential machine (FSM) to manage either a fixed (dynamic) mode of well bias control or an adaptive mode of operation. A functional flow diagram for this sequential machine is shown in FIG. 7. The adaptive mode works in tandem with voltage sensors for sensing the voltage of the virtual rail that are present in the system. The intent is to increase or decrease the amount of gate bias in proportion to the leakage in the system which varies with the operating temperature when the functional blocks have been power gated.

FIG. 7 shows how the states of the bias controller of FIG. 5 change. Initially there is a reset and the bias controller is enabled switching from state S0 to S1. Then the adaptive bias is enabled and the bias controller transitions to state S2. In state S2 it is determined after a certain wait time if the virtual tail has a voltage level within an expected window. If it is greater than the programmed value by more than a predetermined amount then the bias voltage is increased at state S3, and the system waits at state S4 for this increase in bias voltage to feed through the system. The bias controller then returns to state S2 to determine again if the virtual rail is within the expected window.

If the virtual rail had a voltage level that was less than a programmed value by more than a certain amount then it transitions to state S5 and bias voltage is reduced, the bias controller then returns to state S4 where it waits for a certain time and then transitions to state S2 where it determines if the virtual voltage level is within a predetermined window again.

When the adaptive bias is disabled the bias controller transitions to state S1 and if the retention mode is disabled it transitions back to state S0.

Figure 8:
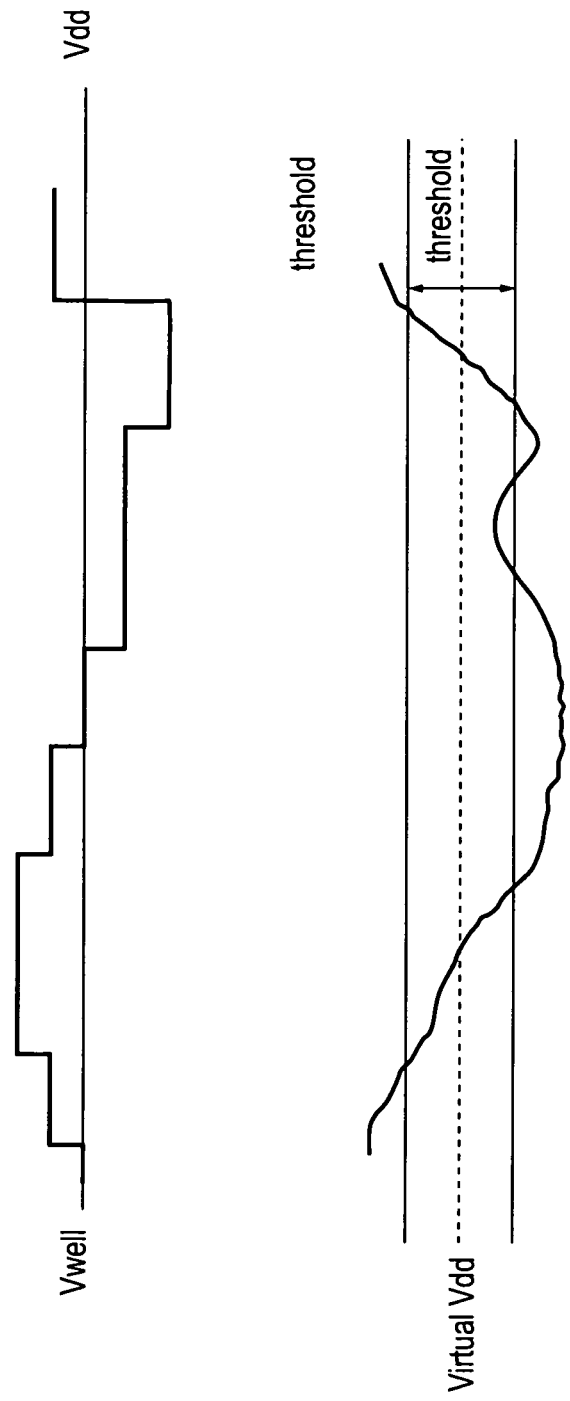
FIG. 8 shows how changes in well bias affect the voltage level of the virtual voltage rail in an adaptive system such as that shown in FIG. 5.

FIG. 8 shows how the voltage bias of the well changes in such an adaptive system and how the changes in voltage bias are mirrored with a time delay into changes in virtual voltage rail. Initially the bias voltage of the well is set at VDD, the well being an N-well and the transistor a PMOS transistor. Due to the current operating conditions the virtual VDD with this bias is outside of the threshold window being in this case too high. The voltage level of the well is therefore increased to reverse bias it and the virtual VDD starts to fall. However, after a certain first time period it is still outside of the desired window so the reverse bias voltage is increased again. The virtual VDD then falls within the desired window so this value of reverse bias is maintained for a while. When the virtual VDD falls below a threshold value perhaps due to a change in temperature then the reverse bias voltage is decreased and as it remains outside of the window after a predetermined time, it is decreased again and then a forward bias is added. After a while the voltage level returns to an acceptable value within the desired window and the bias voltage of the well is maintained.

This figure shows the virtual VDD varying quite frequently, this is shown to illustrate the control of the level and in most situations the virtual VDD would not vary as often as this.

Figure 9:
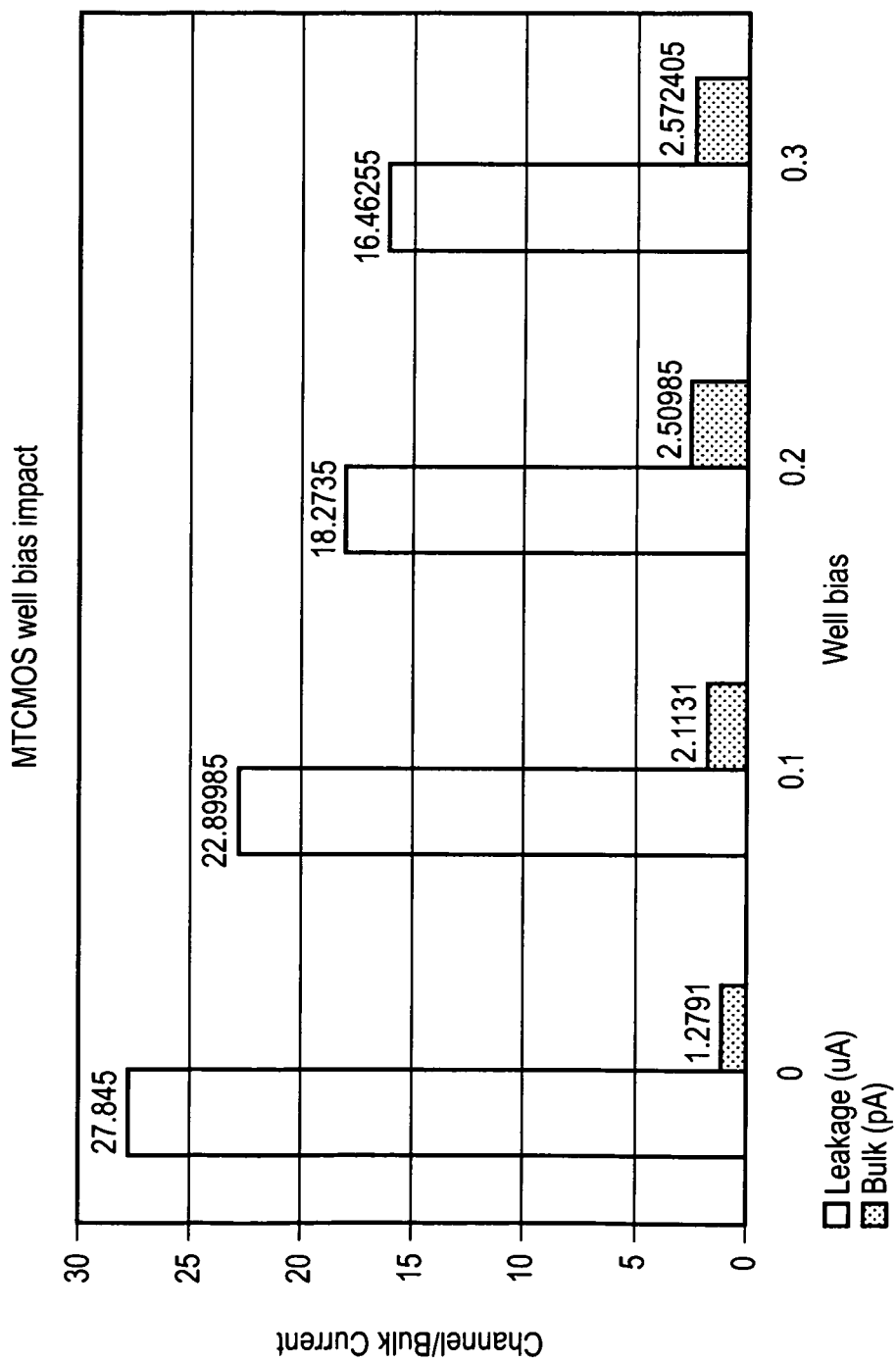
FIG. 9 shows the effect of decreased virtual voltage levels on leakage currents.

FIG. 9 shows the impact of well bias voltage on leakage current. A reduction in leakage current occurs with the fall in virtual voltage rail voltage that is due to an increased source to bulk potential that raises the threshold voltage. As is seen the increase of well bias has diminishing returns in the increase of threshold voltage beyond about 300 mV. The power that is required to cause this to happen i.e. the increase in bulk current caused by the well biasing device is very slight (a current of the order of pA is required) as opposed to the leakage current (of the order of $\mu$A) that is saved.

Figure 10:
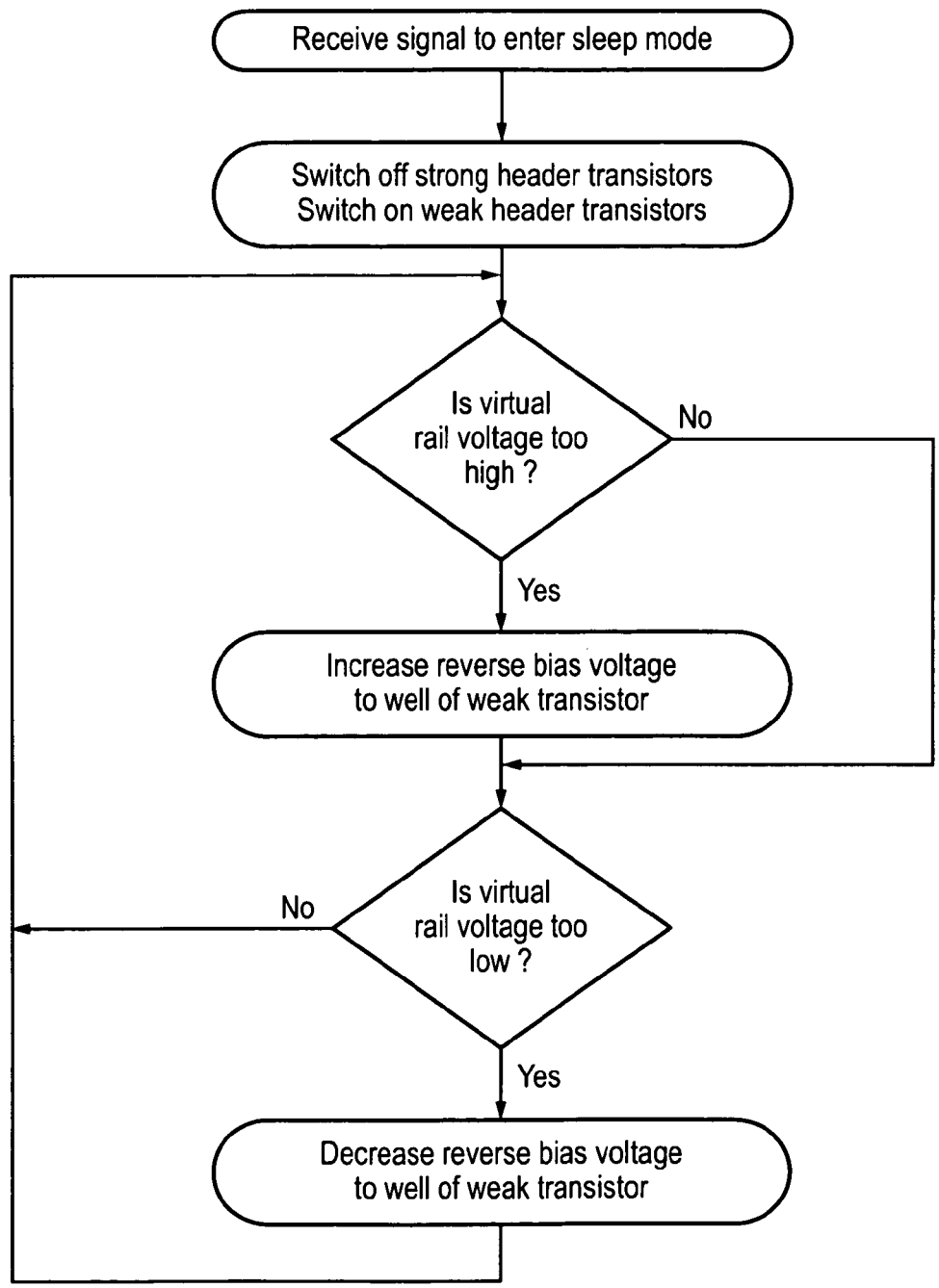
FIG. 10 shows a flow diagram illustrating steps in a method according to an embodiment of the present invention.

FIG. 10 shows a flow diagram illustrating steps in a method according to an embodiment of the present invention. In this embodiment the switching circuitry are header devices, although it would be clear to a skilled person that they could equally well be footer devices.

Initially a signal is received signalling the system should enter sleep or low power mode. The power transistors are switched off and the weak header transistors are switched on and they enter a saturation region of operation. It should be noted that in some embodiments the weak header transistors may be on during functional mode, in which case they remain one.

It is then determined if the virtual rail voltage is too high, that is outside of a desired window. If it is then the reverse bias voltage applied to the well of the weak transistor is increased and the virtual voltage will respond by falling.

If the voltage level was not too high it is determined if it is too low, and if it is the reverse bias voltage is decreased.

The steps are periodically repeated with a sufficient pause between them to allow the system to adjust to the changes in bias voltage before the level of the virtual voltage rail is sensed again.

In summary embodiments of the present invention provide a method for (a) managing the standby leakage current on a chip by adjusting the header well bias over-drive voltage of for example, a MTCMOS (PMOS) transistors in the weakly on-condition and (b) monitoring the virtual rail voltage on silicon using voltage monitor/sensor and thereby adjusting the magnitude of the well bias over-drive voltage to achieve a preferred virtual rail voltage (<power supply voltage) thereby reducing the leakage in the system when it is on standby.

It should be noted that although in the embodiments shown the switching circuitry used to regulate the voltage have been transistors, it should be recognised that other semiconductor switching devices could be used, providing they are operating in their saturation regions such that changes in the well bias voltage changes the saturation current. As is well understood in the art bulk semiconductor devices are formed in "wells". Thus, P devices are formed in N-wells and N devices in P wells. The bias voltage of these wells affect the threshold voltage at which they start to conduct and also the saturation current that they can supply when operating in a saturation region.

Although in the embodiments illustrated above the same voltage level is supplied to all of the logic circuitry, it will be clear to a skilled person that the integrated circuit or chip could have different logic blocks that are operational at different times, and these could each be supplied with power by their own power gating circuits, having both strong transistors to turn the full power on and off and weak devices to control the voltage level supplied using a change in well bias. In this way the voltage level at different blocks could be maintained at different levels as required.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A voltage regulator for regulating a voltage level of a virtual power rail supplying power to logic circuitry in a low power data retention mode, said voltage regulator comprising:

switching circuitry comprising at least one semiconductor device formed within a doped well for coupling said virtual power rail to a power supply having a supply voltage level;

control circuitry responsive to a signal indicating said logic circuitry is to enter said low data power retention mode to control said switching circuitry to switch to a conductive state in which said switching circuitry is operating outside of a linear region of operation and supplying a current from said power supply via said virtual power rail to said logic circuitry; and a leakage power controller for adjusting a voltage level of said virtual power rail to control leakage power, said leakage power controller being configured to supply a bias voltage to said well in which said switching circuitry is formed, said current of said switching circuitry being dependent on a value of said well bias voltage, said leakage power controller being configured to adjust said well bias voltage of said switching circuitry thereby varying said current and said voltage level of said virtual power rail.

2. A voltage regulator according to claim 1, wherein said switching circuitry is operating in a saturation region of operation and said current supplied from said power supply via said virtual power rail is a saturation current.

3. A voltage regulator according to claim 1, wherein said switching circuitry comprises at least one transistor.

4. A voltage regulator according to claim 2, said leakage power controller comprising a voltage sensor for sensing a voltage level of said virtual power rail, said leakage power controller being responsive to detecting a voltage level of said virtual power rail varying away from a predetermined voltage to adjust said well bias voltage to mitigate said detected variation in order to maintain said voltage level of said virtual power rail close to said predetermined voltage.

5. A voltage regulator according to claim 4, wherein, said leakage power controller is configured:

in response to said voltage sensor sensing said voltage level of said virtual power rail moving away from said supply voltage level such that a voltage level applied across said logic circuitry falls below a predetermined low threshold value, to adjust said well bias voltage to increase said saturation current and thereby adjust said voltage level of said virtual power rail towards said supply voltage level; and in response to said voltage sensor sensing said voltage level of said virtual power rail moving towards said supply voltage level such that a voltage applied across said logic circuitry rises above a predetermined high threshold value, to adjust said well bias voltage to decrease said saturation current and adjust said voltage level of said virtual power rail towards said supply voltage level, thereby maintaining a voltage level of said virtual power rail within a range determined by said threshold values.

6. A voltage regulator according to claim 4, comprising an input for receiving a voltage level value from a user, said leakage power controller being responsive to receipt of a value at said input to reset said predetermined voltage level to said received value.

7. A voltage regulator according to claim 4, comprising an error indication input for receiving an indication of error rate from said logic circuitry, said leakage power controller being configured to adjust said predetermined voltage level such that a voltage level applied across said logic circuitry is increased in response to said error rate rising above a high error rate threshold value and to adjust said predetermined voltage level such that a voltage level applied across said logic circuitry is decreased in response to said error rate falling below a low error rate threshold value.

8. A voltage regulator according to claim 2, wherein said predetermined voltage level is selected in dependence upon characteristics of said logic circuitry in order to maintain said voltage level above a level sufficient to retain data and below said supply voltage level to reduce power leakage.

9. A voltage regulator according to claim 3, wherein said switching circuitry comprises at least one weak transistor having a low conductance when switched to said conductive state, such that it operates in a saturation region of operation when supplying current to said logic circuitry.

10. A voltage regulator according to claim 9, wherein said switching circuitry comprises a plurality of weak transistors, said plurality of weak transistors being formed in a same shared well, said leakage power controller supplying said bias voltage to said shared well such that a saturation current of said plurality of weak transistors are adjusted together.

11. A voltage regulator according to claim 10, wherein said plurality of weak transistors are arranged in parallel with each other, such that said drain nodes are coupled to said logic circuitry and said source nodes are coupled to said power supply.

12. A voltage regulator according to claim 9, further comprising at least one strong power transistor, said at least one strong transistor having a high conductance when switched to a conductive such that when supplying current to said logic circuitry said strong transistor is operating in said linear region of operation;

said control circuitry being responsive to a signal indicating said logic circuitry is to operate in a functional mode to control said at least one strong power transistor to be in said conductive state operating in said linear region and supplying a current from said power supply to said logic circuitry; and being responsive to a signal indicating said logic circuitry is to operate in said low power retention mode to switch said at least one strong power transistor to a non-conductive state.

13. A voltage regulator according to claim 1, wherein said power supply comprises a high voltage rail and a ground rail and said switching circuitry comprises header circuitry arranged between said high voltage rail and said virtual rail, said virtual rail being a high voltage virtual rail and said at least one transistor comprising at least one pmos transistor.

14. A voltage regulator according to claim 1, wherein said power supply comprises a high voltage rail and a ground rail and said switching circuitry comprises footer circuitry arranged betweens said low voltage rail and said virtual rail, said virtual rail being a ground virtual rail and said at least one transistor comprising at least one nmos transistor.

15. An integrated circuit comprising:

at least one voltage regulator according to claim 1 at least one block of logic circuitry, said at least one voltage regulator being configured to regulate a voltage level supplied to said at least one block of logic circuitry.

16. A method of regulating a voltage level of a virtual power rail supplying power to logic circuitry in a low power data retention mode comprising the steps of:

in response to a signal indicating said logic circuitry is to enter said low power data retention mode, switching semiconductor switching circuitry formed within a doped well to a conductive state in which said semiconductor switching circuitry is operating outside of a linear region of operation and supplying a current from a power supply via said virtual power rail to said logic circuitry; and adjusting a bias voltage supplied to a well of said switching circuitry to adjust said voltage level of said virtual power rail, wherein said current of said switching circuitry is dependent on a value of said well bias voltage, such that adjusting said well bias voltage of said switching circuitry varies said current and therefore said voltage level of said virtual power rail.

17. A method according to claim 16, wherein said semiconductor switching circuitry is switched to operate in a saturation region of operation and said current of said switching circuitry is a saturation current.

18. A method according claim 17, comprising a further step of:
   sensing a voltage level of said virtual power rail; and
   in response to detecting a voltage level of said virtual power rail varying away from a predetermined voltage adjusting said well bias voltage to mitigate said detected variation in order to maintain said voltage level of said virtual power rail close to said predetermined voltage.

19. A method according to claim 18, comprising the further steps of:
   in response to said sensing step sensing said voltage level of said virtual power rail moving away from said supply voltage level such that a voltage level applied across said logic circuitry falls below a predetermined low threshold value:
   adjusting said well bias voltage to increase said saturation current and thereby adjust said voltage level of said virtual power rail towards said supply voltage level; and
   in response to said sensing step sensing said voltage level of said virtual power rail moving towards said supply voltage level such that a voltage applied across said logic circuitry rises above a predetermined high threshold value:
   adjusting said well bias voltage to decrease said saturation current and thereby adjust said voltage level of said virtual power rail towards said supply voltage level, thereby maintaining a voltage level of said virtual power rail within a range determined by said threshold values.

20. A method according to claim 18, comprising further steps of:
   receiving a voltage level value from a user; and
   resetting said predetermined voltage level to said received value.

21. A method according to claim 18, comprising the further steps of:
   receiving an error rate from said logic circuitry;
   adjusting said predetermined voltage level such that a voltage level applied across said logic circuitry is increased in response to said error rate rising above a high error rate threshold value; and
   adjusting said predetermined voltage level such that a voltage level applied across said logic circuitry is decreased in response to said error rate falling below a low error rate threshold value.

22. A voltage regulator means for regulating a voltage level of a virtual power rail supplying power to logic circuitry in a low power data retention mode, said voltage regulator comprising:
   switching means for coupling said virtual power rail to a power supply having a supply voltage level, said switching means comprising at least one semiconductor device formed in a doped well;
   control means responsive to a signal indicating said logic circuitry is to enter said low data power retention mode for controlling said switching means to be switched to a conductive state in which it is operating in a saturation region of operation and for supplying a saturation current from said power supply via said virtual power rail to said logic circuitry; and
   a leakage power control means for adjusting a voltage level of said virtual power rail to control leakage power, said leakage power control means being for supplying a bias voltage to said well of said switching means, said saturation current of said switching means being dependent on a value of said well bias voltage, said leakage power control means being for adjusting said well bias voltage of said switching means thereby varying said saturation current and said voltage level of said virtual power rail.

* * * * *